(12) United States Patent
Tsai et al.

(10) Patent No.: US 7,755,903 B2
(45) Date of Patent: Jul. 13, 2010

(54) HEAT DISSIPATION APPARATUS

(75) Inventors: Lung-Sheng Tsai, Tu-Cheng (TW); Li-Ping Chen, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/209,651

(22) Filed: Sep. 12, 2008

(65) Prior Publication Data

US 2010/0014243 A1 Jan. 21, 2010

(30) Foreign Application Priority Data

Jul. 21, 2008 (CN) .......................... 2008 2 0301557

(51) Int. Cl.
*H05K 7/20* (2006.01)

(52) U.S. Cl. .................. 361/719; 361/704; 257/718; 257/719

(58) Field of Classification Search .................. 361/690, 361/703, 704, 718, 719; 257/718, 719; 174/16.1, 174/16.3; 165/80.2, 80.3
See application file for complete search history.

(56) References Cited

U.S. PATENT DOCUMENTS

| 5,065,279 | A | * | 11/1991 | Lazenby et al. | 361/720 |
|---|---|---|---|---|---|
| 5,088,190 | A | * | 2/1992 | Malhi et al. | 29/843 |
| 5,241,453 | A | * | 8/1993 | Bright et al. | 361/704 |
| 5,307,236 | A | * | 4/1994 | Rio et al. | 361/720 |
| 6,034,874 | A | * | 3/2000 | Watanabe | 361/704 |
| 6,134,112 | A | * | 10/2000 | LeCornu et al. | 361/720 |
| 6,191,480 | B1 | * | 2/2001 | Kastberg et al. | 257/727 |
| 6,219,238 | B1 | * | 4/2001 | Andros et al. | 361/704 |
| 6,574,109 | B1 | * | 6/2003 | McHugh et al. | 361/719 |
| 6,618,253 | B1 | * | 9/2003 | Szu et al. | 361/719 |
| 6,700,782 | B1 | * | 3/2004 | Bopp et al. | 361/704 |
| 7,362,581 | B2 | * | 4/2008 | Chen | 361/709 |
| 7,463,496 | B2 | * | 12/2008 | Robinson et al. | 361/818 |

* cited by examiner

*Primary Examiner*—Boris L Chervinsky
(74) *Attorney, Agent, or Firm*—D. Austin Bonderer

(57) ABSTRACT

A heat dissipating apparatus includes a base, a heat sink received in the base, and a retaining cover attached to the base. The retaining cover defines two crossing slots for cooperatively forming at least one flap. Each free portion of flap has a free portion. The free portion of each flap elastically curves towards the heat sink to bias the heat sink towards the base.

13 Claims, 4 Drawing Sheets

HEAT DISSIPATION APPARATUS

BACKGROUND

1. Technical Field

The present invention relates to a heat dissipating apparatus and, more particularly, to a heat dissipating apparatus with a retaining cover.

2. Description of Related Art

A typical heat dissipating apparatus may include a heat sink having fins. This type of thermal device is usually mounted in an electronic device in a manner such as by screwing or riveting. These manners of attachment can be time-consuming. Another type of heat dissipating apparatus may include a fan, a bracket, a clasp, a heat sink and a base. The bracket has a U-shaped configuration, and includes a top panel and two side panels extending perpendicularly from two opposite edges of the top panel. Two cutouts are defined in a bottom portion of each side panel. The clasp is integrally formed, and includes an elastic portion and two locking portion bent from two portions of the elastic portion. A hook is formed on an end of each locking portion. Two through channels are defined in the thermal device corresponding to the cutouts for holding the elastic portion. This type of heat dissipating apparatus also has a complicated configuration and can also be time-consuming to manufacture.

Therefore, there is room for improvement within the art.

DETAILED DESCRIPTION OF THE EMBODIMENTS

Figure 1:
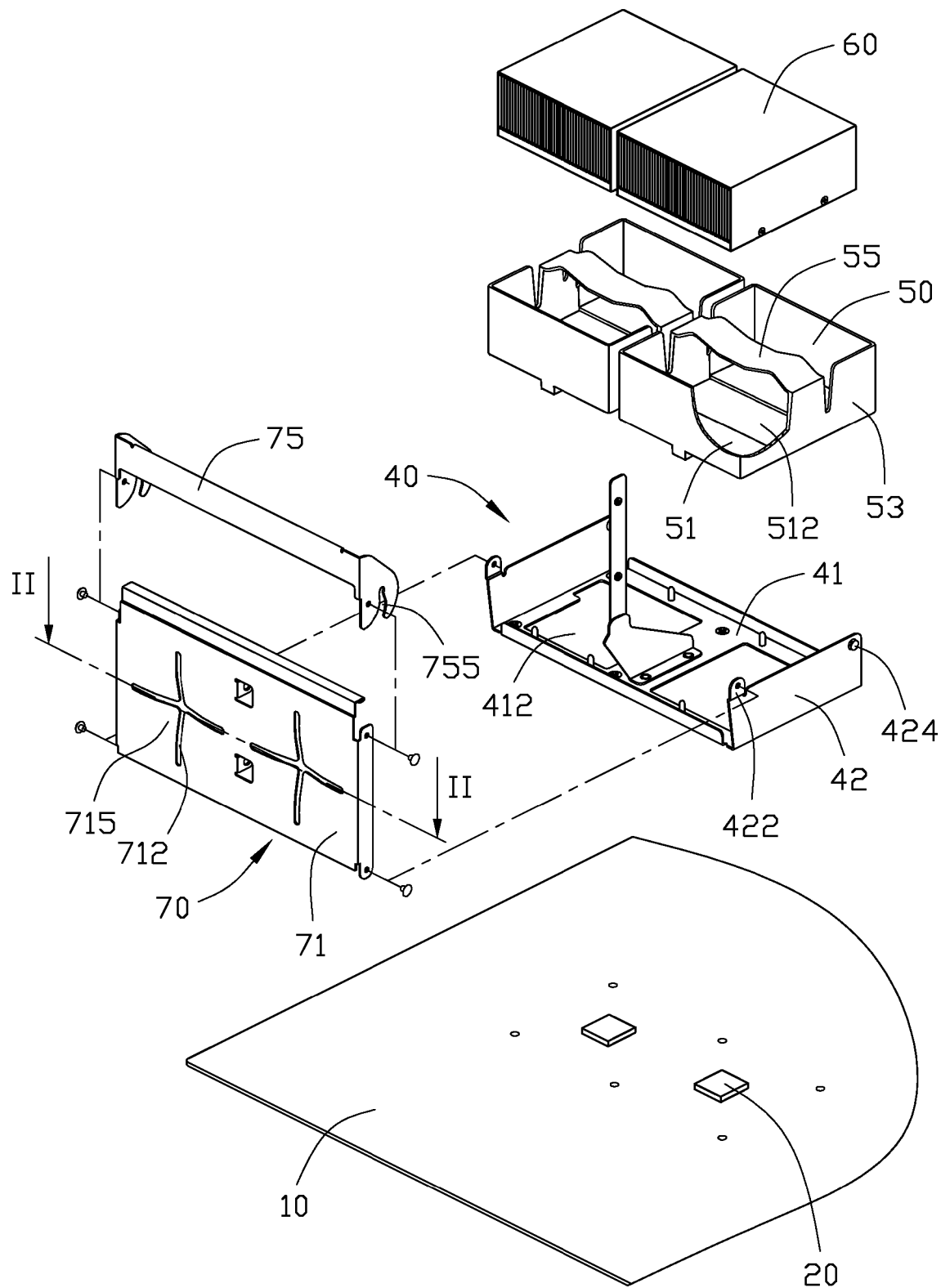
FIG. 1 is an exploded isometric view of a heat dissipating apparatus for a heat generating element on a motherboard of an embodiment of the present invention, the heat dissipating apparatus includes a base, two heat sinks, two heat sink holders and a retaining cover.

Referring to FIG. 1, an embodiment of a heat dissipating apparatus includes a base 40, two heat sink holders 50, two heat sinks 60, and a retaining cover 70. In the embodiment, the heat dissipating apparatus can dissipate heat from two heat generating elements 20 on a motherboard 10.

The base 40 includes a bottom panel 41 and two side panels 42 extending perpendicularly from two opposite sides of the bottom panel 41. Two square openings 412 are defined in the bottom panel 41. A post 424 and a pivot portion 422 are formed on opposite ends of an edge of each side panel 42.

Each heat sink holder 50 includes a bottom wall 51 and four side walls 53 extending from four edges of the bottom wall 51 such that a receiving space is enclosed by the bottom wall 51 and the side walls 53 for receiving the heat sink 60. An opening 512 is defined in the bottom wall 51. Each sink holder 50 includes a strap handle 55 attached to opposite sides walls 53 of the sink holder 50.

Each heat sink 60 includes a plurality of heat dissipating fins.

Figure 2:
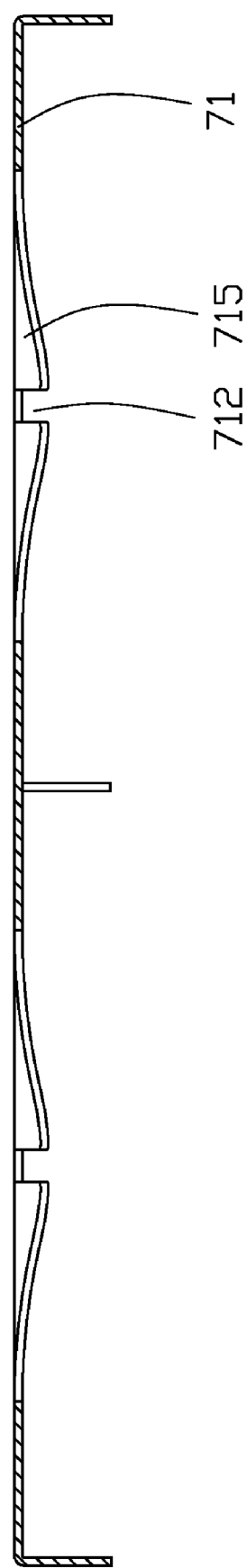
FIG. 2 is a cross sectional view of the retaining cover in direction 11 of the heat dissipating apparatus of FIG. 1.

The retaining cover 70 includes a plate 71. Two crossing slots 712 are defined in the plate 71 and form four inner corner-shaped flaps 715 in four quadrants. As further shown in FIG. 2, each free portion of flap 715 has a free portion, and each free portion of flap 715 curves inward towards the sink holder 50. The plate 71 is partially depressed inwards due to the curve of the free portions of flaps 715. A latching member 75 is pivotally attached to the plate 71. Two retaining notches 755 are defined in the latching member 75 corresponding to the posts 424. A width of each retaining notch 755 decreases from a side of the latching member 75 to where the retaining notch 755 engages with the post 424.

Figure 3:
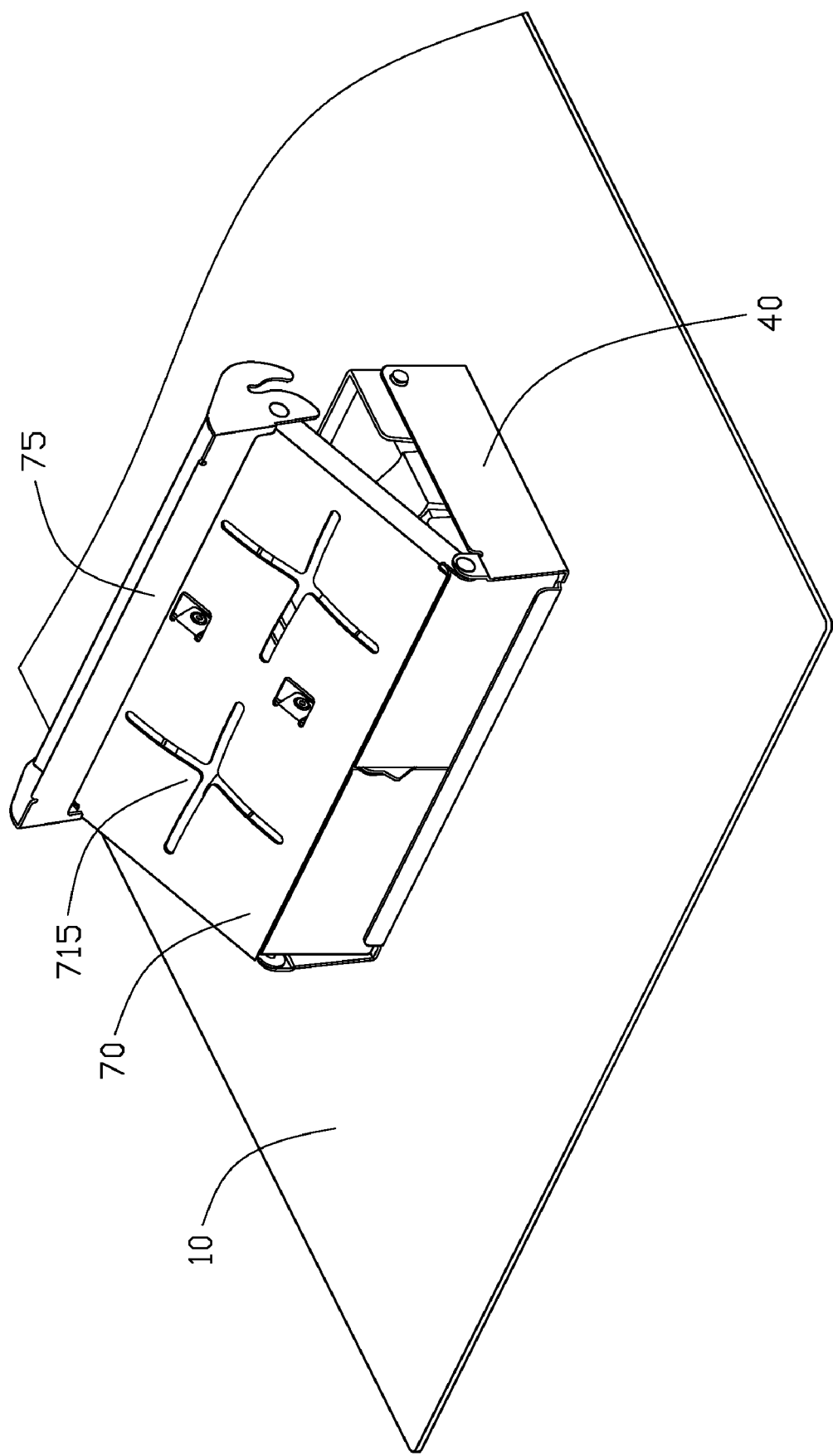
FIG. 3 is an assembled view of the heat dissipating apparatus of FIG. 1.

Referring to FIG. 3, the base 40 is fixed on the motherboard 10 with each heat generating element 20 exposed in each opening 412. Each heat sink 60 is placed in the receiving space of each holder 50. Then the holders 50 are respectively mounted on the base 40 with each heat generating element 20 directly contacting the heat sink 60. The retaining cover 70 is pivotally attached to the base 40 at the pivot portions 422. The latching member 75 is pivotally attached on the plate 71 opposite to the pivot portions 422.

Figure 4:
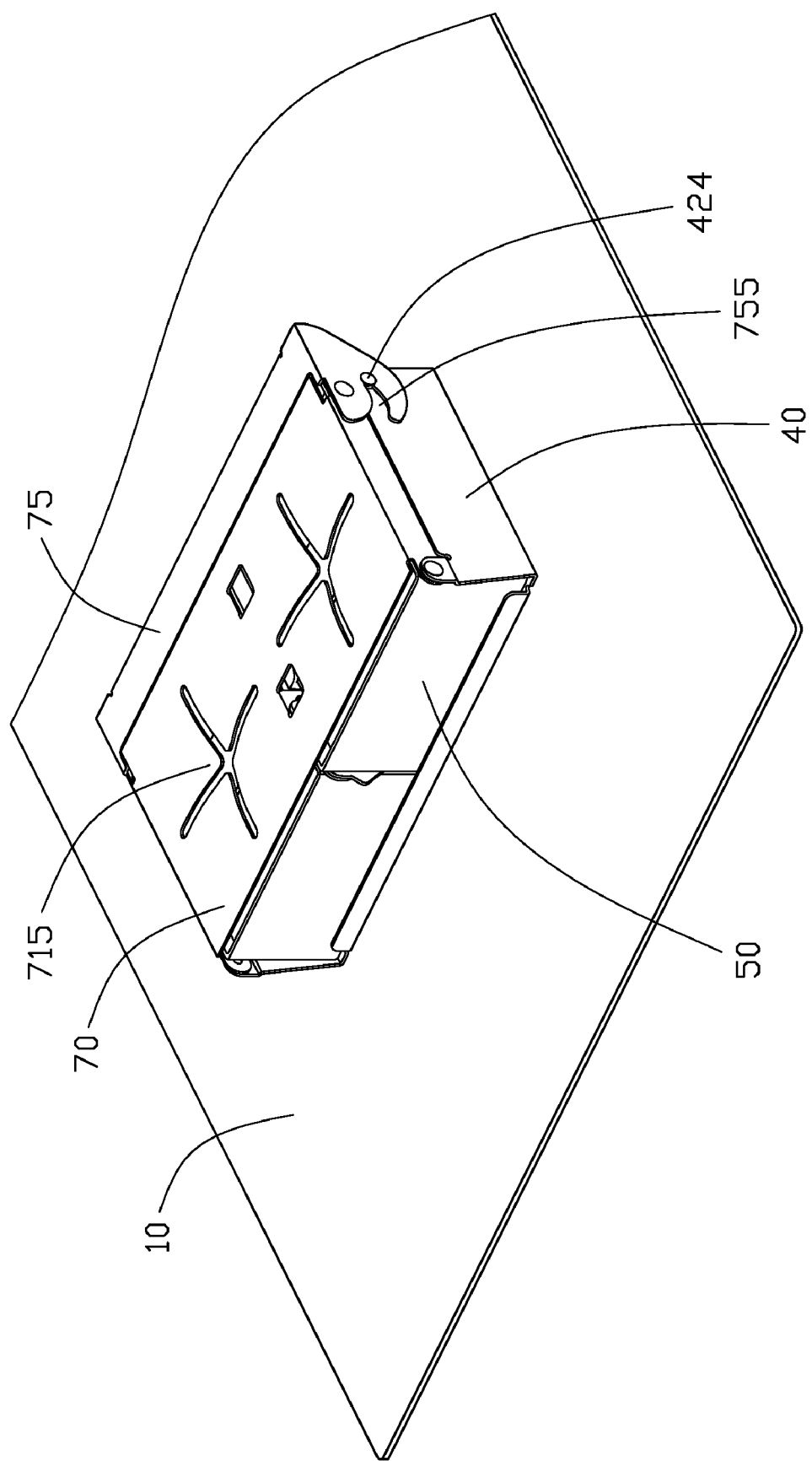
FIG. 4 is an assembled view of the heat dissipating apparatus of FIG. 1, but shown the retaining cover rotated to the heat sink.

Referring to FIG. 4, the retaining cover 70 is rotated down, the portions of the flaps 715 elastically abut the strap handles 55 to urge the heat sinks 60 into tight contact against the heat generating elements 20. The latching member 75 is rotated down such that the posts 424 are engaged in the corresponding retaining notches 755. The retaining cover 70 is mounted on the base 40.

It is to be understood, however, that even though numerous characteristics and advantages of the present embodiments have been set forth in the foregoing description, together with details of the apparatus and function of the embodiments, the disclosure is illustrative only, and changes may be made in detail, especially in matters of shape, size, and arrangement of parts within the principles of the embodiments to the full extent indicated by the broad general meaning of the terms in which the appended claims are expressed.

What is claimed is:

1. A heat dissipating apparatus comprising:
   a base;
   a heat sink received in the base, and
   a retaining cover attached to the base, the retaining cover defining two crossing slots for cooperatively forming at least one flap, each flap has a free portion, the free portion of each flap elastically curving towards the heat sink to bias the heat sink towards the base;
   wherein the retaining cover includes a latching member pivotably attached thereon, a retaining notch is defined in the latching member; and a post protrudes from the base for engaging with the retaining notch.

2. The heat dissipating apparatus of claim 1, wherein the retaining cover is pivotally attached to the base.

3. The heat dissipating apparatus of claim 1, wherein a width of the notch decreases from an out side edge to where the retaining notch engages with the post.

4. The heat dissipating apparatus of claim 1, wherein the pivot point of the retaining cover and the base is positioned on an edge of the cover opposite to the latching member.

5. The heat dissipating apparatus of claim 1, wherein the retaining cover is partially depressed at a crossing portion of the slots due to the curve of the at least one flap.

6. The heat dissipating apparatus of claim 1, wherein the slots are perpendicular to each other, and the at least one flap comprises four corner-shaped flaps in four quadrants.

7. A heat dissipating assembly comprising:
   a motherboard;
   a heat generating element arranged on the motherboard;
   a base fixed on the motherboard;

a heat sink received in the base, the heat sink configured for contacting the heat generating element; and a retaining cover attached to the base, at least one inner flap formed on the retaining cover, each flap having a free end portion, the free end portion of each flap urging the heat sink in contact with the heat generating element, wherein the retaining cover defines two crossing slots, and four corner-shaped flaps are formed by defining of the slots in four quadrants.

8. The heat dissipating assembly of claim 7, wherein the retaining cover is pivotally attached to the base.

9. The heat dissipating assembly of claim 8, wherein the retaining cover includes a latching member pivotally attached thereto, a retaining notch is defined in the latching member; a post protrudes from the base for corresponding with the retaining notch.

10. The heat dissipating assembly of claim 9, wherein a width of the retaining notch decreases from an outer edge to where the retaining notch engages with the post.

11. The heat dissipating assembly of claim 9, wherein the pivot point of the retaining cover and the base is positioned on an edge of the retaining cover opposite to the latching member.

12. The heat dissipating assembly of claim 7, wherein the free portions are curved to elastically abut the heat sink, and the retaining cover is partially depressed at an crossing portion of the slots due to the curve of the free portion.

13. The heat dissipating assembly of claim 7, wherein the slots are perpendicular to each other.

* * * * *